United States Patent
Toyoda et al.

(10) Patent No.: US 7,034,405 B2
(45) Date of Patent: Apr. 25, 2006

(54) RESIN COMPONENT FOR ENCAPSULATING SEMICONDUCTOR AND SEMICONDUCTOR DEVICE USING IT

(75) Inventors: Junichi Toyoda, Tokyo (JP); Katsumi Okayama, Kanagawa (JP); Kazumasa Igarashi, Mie (JP)

(73) Assignees: Sony Corporation, Tokyo (JP); Nitto Denko Corporation, Osaka (JP)

( * ) Notice: Subject to any disclaimer, the term of this patent is extended or adjusted under 35 U.S.C. 154(b) by 0 days.

(21) Appl. No.: 10/165,394

(22) Filed: Jun. 7, 2002

(65) Prior Publication Data

US 2003/0030155 A1 Feb. 13, 2003

(30) Foreign Application Priority Data

Jun. 8, 2001 (JP) .......................... P2001-173780

(51) Int. Cl.
 *H01L 23/29* (2006.01)
(52) U.S. Cl. ..................................... 257/788
(58) Field of Classification Search ......... 257/787–796
 See application file for complete search history.

(56) References Cited

U.S. PATENT DOCUMENTS

| | | | |
|---|---|---|---|
| 4,529,755 A * | 7/1985 | Nishikawa et al. | 523/436 |
| 5,807,611 A * | 9/1998 | Bearinger et al. | 427/374.7 |
| 5,948,384 A * | 9/1999 | Filler | 424/1.29 |
| 6,097,100 A * | 8/2000 | Eguchi et al. | 257/787 |
| 6,310,120 B1 * | 10/2001 | Shiobara et al. | 523/458 |
| 6,534,707 B1 * | 3/2003 | Bator et al. | 174/35 R |

FOREIGN PATENT DOCUMENTS

| JP | 323654 | 1/1991 |
|---|---|---|
| JP | 11163483 | 6/1999 |

OTHER PUBLICATIONS

The American Heritage® Dictionary of the English Language, Third Edition copyright© 1992 by Houghton Mifflin Company. Electronic version licensed from INSO Corporation.*

* cited by examiner

*Primary Examiner*—Leonardo Andujar
(74) *Attorney, Agent, or Firm*—Sonnenschein, Nath & Rosenthal LLP

(57) ABSTRACT

A resin component for encapsulating a semiconductor includes magnetic powder and silica powder whose average particle diameter is smaller than the average particle diameter of the magnetic powder. Thus, the curing body of the resin component for encapsulating a semiconductor has an electromagnetic wave shielding function by the magnetic powder. Since the spaces of the magnetic powder are filled with the silica powder whose average particle diameter is small, the moldability of the curing body is improved and the insulating characteristics thereof are enhanced. Such a resin component for encapsulating a semiconductor is employed, there can be produced a preferably formed and encapsulated semiconductor device having the electromagnetic wave shielding function and having no malfunction generated due to leakage current from a semiconductor element.

6 Claims, 2 Drawing Sheets

RESIN COMPONENT FOR ENCAPSULATING SEMICONDUCTOR AND SEMICONDUCTOR DEVICE USING IT

RELATED APPLICATION DATA

The present application claims priority to Japanese Application(s) No(s). P2001-173780 filed Jun. 8, 2001, which application(s) is/are incorporated herein by reference to the extent permitted by law.

BACKGROUND OF THE INVENTION

1. Field of the Invention

The present invention relates to a resin component for encapsulating a semiconductor and more particularly to a resin component for encapsulating a semiconductor in which a curing body has an electromagnetic wave shielding function and insulating characteristics.

2. Description of Related Art

In a manufacturing process of a semiconductor device, a semiconductor element whose bonding to a substrate is completed is encapsulated by employing a molded resin such as a thermosetting resin in order to avoid a contact with an external part. As the molded resin, for instance, there is employed a material obtained by mixing and dispersing an inorganic filler including silica powder as a main component in an epoxy resin. As the encapsulating method, for instance, has been put to practical use a transfer molding method in which the semiconductor element bonded to the substrate is inserted into a die, and the molded resin is supplied under pressure thereto and is cured to be molded.

A resin encapsulated type semiconductor device in which a semiconductor element is encapsulated by a molded resin has been hitherto excellent in view of reliability, mass-productivity and low cost, so that this semiconductor device has been popularized as well as a ceramic encapsulated type semiconductor device which is encapsulated by using a ceramic case having a ceramic material as a component material.

In an electronic device, an EMC (Electro-Magnetic Compatibility) has been paid attention to. For instance, in recent years, the development of compact and highly functional information communication devices has been advanced. For obtaining the higher functions of semiconductor elements used in such devices, the operating frequencies of them have been more raised. Especially, in increasing the speed of a digital signal, the amplitude of the signal has been decreased in order to reduce consumed power. As a result, there has been increased a possibility that the semiconductor elements may cause malfunctions even under small and weak high frequency noise. Therefore, the development of the electronic devices which do not emit unnecessary electromagnetic waves or have durability relative to the electromagnetic waves generated in the circumference has progressed.

As one of the countermeasures of such a problem, there has been proposed a method that the semiconductor element is covered with a metallic cap so that electromagnetic waves generated by the semiconductor element or electromagnetic waves generated by the circumference are discharged outside the semiconductor element. However, in this method, since a mounting space in which the metallic cap is disposed is required, the packaging density of the electronic device cannot be raised, and accordingly, it is difficult to meet a compact device.

Thus, an electromagnetic wave shielding technique suitable for a high density mounting has been necessary and a method for providing an electromagnetic wave shielding function in a molded resin has been proposed.

However, when the conventional resin component obtained by mixing and dispersing only the filler including the silica powder as the main component in the epoxy resin is employed as the molded resin, the curing body for encapsulating a semiconductor element does not exhibit the electromagnetic wave shielding function.

In Japanese Patent Application Laid-Open No. hei 3-23654, a method for using a molded resin in which ferrite powder is mixed is proposed in order to prevent the entry of electromagnetic waves. When only the ferrite powder is independently employed for a filler of epoxy resin, a curing body for encapsulating a semiconductor element has the electromagnetic wave shielding function, however, the resin flashes may be formed inside a die upon molding, so that, sometimes, an excellent curing body cannot be obtained.

In Japanese Patent Application Laid-Open No. hei 6-151626 and Japanese Patent Application Laid-Open No. hei 11-40708 or the like, a molded resin in which ferrite powder is mixed is likewise proposed, however, its moldability is not described.

Further, since the curing body for encapsulating the semiconductor element includes ferrite, there exist a risk that electric current may leak to cause the malfunction of the semiconductor element due to the contact of the semiconductor element with the curing body depending on the kinds or content thereof.

SUMMARY OF THE INVENTION

The present invention is proposed by considering the above-described problems and it is an object of the present invention to provide a resin component for encapsulating a semiconductor in which a curing body has an electromagnetic wave shielding function and insulating characteristics and shows good moldability upon curing.

According to the present invention, there is provided a resin component for encapsulating a semiconductor which encapsulates a semiconductor element comprising: an epoxy resin showing thermosetting characteristics; a phenolic resin curing agent as the curing agent of the epoxy resin; and silica powder and magnetic powder as the filler of the epoxy resin, wherein the average particle diameter of the silica powder is smaller than the average particle diameter of the magnetic powder.

According to the above-described constitution, since the resin component for encapsulating a semiconductor includes the magnetic powder and the silica powder, the curing body of the resin component for encapsulating a semiconductor has an electromagnetic wave shielding function owing to the presence of the magnetic powder. Further, since the spaces of magnetic particles of the magnetic powder dispersed in the epoxy resin are filled with the silica powder whose average particle diameter is smaller than the average particle diameter of the magnetic powder and the silica powder is dispersed in the peripheries of the magnetic particles, the moldability of the curing body is improved and the insulating characteristics thereof are enhanced. Further, such silica powder is included, so that the molten viscosity of the resin component for encapsulating a semiconductor is properly maintained and the resin component is spread and extended to the minute parts of the semiconductor element to be encapsulated. Accordingly, the resin leaking from a die or the like is reduced.

BRIEF DESCRIPTION OF THE DRAWINGS

The objects and other objects and advantages of the present invention will appear more clearly from the following description in conjunction with the accompanying drawings in which.

DETAILED DESCRIPTION OF THE PREFERRED EMBODIMENTS

Figure 1:
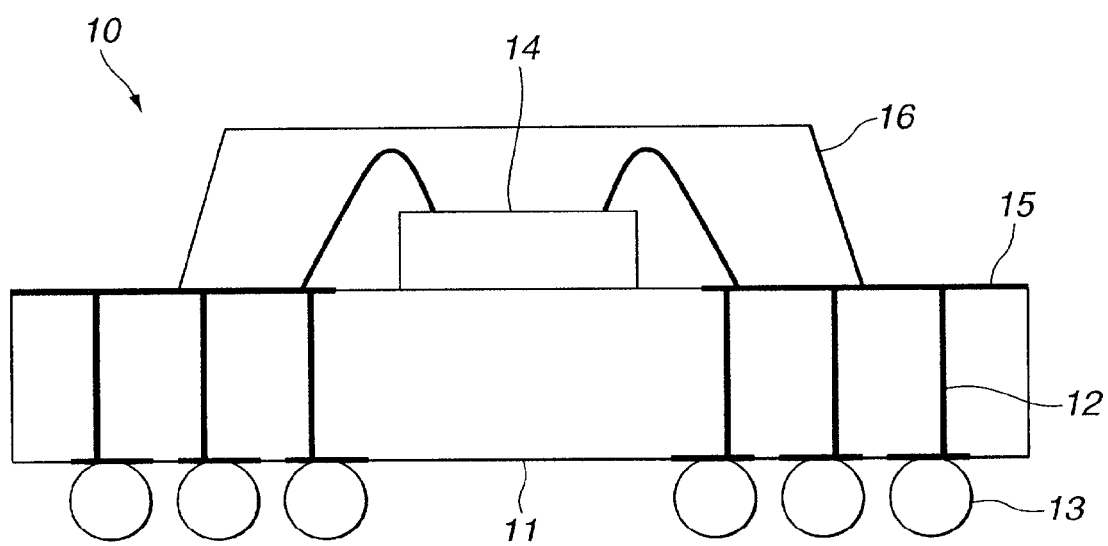
FIG. 1 is a schematic sectional view showing one embodiment of a semiconductor device using a resin component for encapsulating a semiconductor according to the present invention.

Now, an embodiment of the present invention will be described below.

A resin component for encapsulating a semiconductor mainly includes an epoxy resin, a phenolic resin curing agent, a curing accelerator, silica powder and magnetic powder.

As the epoxy resins, there can be employed epoxy resins showing the thermosetting property of a solid at ordinary temperature, for example, biphenyl epoxy resins, phenolic novolac epoxy resins, cresol novolac epoxy resins, etc.

As the phenolic resin curing agents, there can be employed curing agents which serve as the curing agents of the epoxy resins and remain solids at ordinary temperature, for instance, phenolic novolac, cresol novolac, bisphenol A novolac, naphthol novolac, phenol aralkyl resins, etc.

As the curing accelerators, there can be used, for instance, tertiary amines such as 1,8-diazabicyclo (5,4,0) undecene-7, imidazoles such as 2-methyl imidazole, phosphorous curing accelerators such as triphenyl phosphine, tetraphenylphosphonium tetraphenylborate, etc.

As the silica powder, there can be employed spherical molten silica powder, ground silica powder and crushed silica powder. Especially, the spherical silica powder is employed so that the molten viscosity of the resin component for encapsulating a semiconductor is more effectively decreased.

As the magnetic powder, ferrite expressed by $MFe_2O_4$ or $MO \cdot nFe_2O_3$ (n is an integer) can be used. Here, M designates bivalent metal and Mn, Co, Ni, Cu, Zn, Ba, Mg and so on. Further, there may be employed various kinds of metallic powder such as silicon steel powder, permalloy, Co-based amorphous alloy, alloy powder, magnetic powder as well as these ferrites.

In the resin component for encapsulating a semiconductor containing the above-described materials as constituents, the mixing ratio of the phenolic resin curing agent relative to the epoxy resin is preferably set to a range in which a hydroxyl equivalent weight of 0.5 to 1.6 is included in a phenolic resin relative to an epoxy equivalent weight of 1 included in the epoxy resin, more preferably set to a range of a hydroxyl equivalent weight of 0.8 to 1.2.

Further, the content of the curing accelerator is ordinarily set to a range of 0.5 to 10 parts by weight relative to the phenolic resin curing agent of 100 parts by weight.

As the silica powder, is preferably employed silica powder whose average particle diameter is 1 μm to 40 μm and whose maximum particle diameter is 200 μm or smaller.

The curing body of the resin component for encapsulating a semiconductor converts energy generated when electromagnetic waves are absorbed into heat. The conversion efficiency of the energy is dependent respectively on the values the imaginary part ϵ "of a complex permittivity representing the permittivity of the curing body by a complex notation and the imaginary part" of a complex permeability representing a magnetic permeability by a complex notation. These values respectively indicate the dielectric loss and the magnetic loss of incident electromagnetic wave energy. As each value becomes larger, the energy conversion efficiency is increased, and accordingly, an electromagnetic wave shielding effect is increased.

Here, it is understood that, when the magnetic powder is employed together with the silica powder as the resin component for encapsulating a semiconductor, the value of the imaginary part " becomes small. Thus, the absorption effect of electromagnetic waves is not increased, and accordingly, the electromagnetic wave shielding effect is inconveniently decreased.

In the resin component for encapsulating a semiconductor, when the average particle diameter of the silica powder is smaller than 1 μm, the value of the imaginary part becomes too small to increase the absorption effect of the electromagnetic waves. Further, when the average particle diameter exceeds 40 μm, the absorption effect of the electromagnetic waves is not terribly increased. Still further, when the maximum particle diameter exceeds 200 μm, an imperfect injection of the resin component to a die is apt to be generated upon molding the resin component for encapsulating a semiconductor by a low pressure transfer molding method.

As the magnetic powder to be used together with the silica powder, is preferably employed magnetic powder whose average particle diameter ranges from 10 μm to 50 μm and whose maximum particle diameter is 200 μm or smaller.

When the average particle diameter of the magnetic powder is smaller than 10 μm, the value of the imaginary part " is small and the absorption effect of the electromagnetic waves is not enhanced. Further, when the average particle diameter of the magnetic powder exceeds 50 μm, the absorption effect of the electromagnetic waves is not terribly increased. Further, when the maximum particle diameter of the magnetic powder exceeds 200 μm, the imperfect injection of the resin component to a die is liable to be generated upon molding the resin component for encapsulating a semiconductor by the low pressure transfer molding method.

The average particle diameter and the maximum particle diameter of the silica powder and the magnetic powder can be measured by employing, for instance, a laser scattering particle size distribution analyzer.

The total content of the silica powder and the magnetic powder in the resin component for encapsulating a semiconductor is preferably set to 95 wt % as much as the resin component for encapsulating a semiconductor, more preferably to 20 wt % to 95 wt % and specially preferably to 40 wt % to 90 wt %. When the total content of the silica powder and the magnetic powder is lower than 10 wt % as much as the resin component for encapsulating a semiconductor, the electromagnetic wave shielding effect of the curing body is insufficient. When the total content of the silica powder and the magnetic powder exceeds 95 wt %, the molten viscosity of the resin component for encapsulating a semiconductor is increased upon molding.

Further, the mixing ratio of the silica powder to the magnetic powder is preferably set in such a manner that the weight of the silica powder is set to 50 wt % or lower as much as the total weight of the silica powder and the magnetic powder. When the silica powder exceeds 50 wt %, the number of silica particles dispersed in the peripheries of ferrite particles is increased, so that the electromagnetic wave shielding effect of the curing body is insufficient.

The resin component for encapsulating a semiconductor having the above-described composition is ordinarily formed in the shape of powder, tablets produced by tabletizing the powder, or cylindrically granulated powder formed after the resin component for encapsulating a semiconductor is melted and kneaded.

Various kinds of fillers may be added to the resin component for encapsulating a semiconductor depending on the use of a semiconductor device or a using environment or the like. As such fillers, there may be employed, for example, calcium carbonate powder, titanium white, alumina powder, silicon nitride powder, etc. These materials may be independently utilized or two or more kinds of them may be mixed and the mixture may be employed.

Further, with the resin component for encapsulating a semiconductor, may be mixed addition agents such as an stress-reducing agent, a pigment, a mold releasing agent, a coupling agent and a flame retardant as required.

As such stress-reducing agents, there may be employed silicone compounds such as side chain ethylene glycol type dimethylsiloxane, acrylonitrile-butadiene rubber, etc.

As the pigment, there may be employed carbon black, titanium oxide, etc.

As the mold releasing agents, there may be employed polyethylene wax, camauba wax, fatty acid salts, etc.

As the coupling agents, there may be used silane coupling agents such as γ-glycidoxypropyl trimethoxysilane, β-(3,4-epoxycyclohexyl) ethyl trimethoxysilane, etc.

As the flame retardants, brominated epoxy resins may be used. Further, a flame retardant assistant such as antimony trioxide or the like may be used.

Further, as the flame retardant of the resin component for encapsulating a semiconductor, composite metal hydroxide may be added and employed as well as the above-described constituents. The composite metal hydroxide has a crystal form of polyhedron and large crystal growth in the direction of its thickness differently from a conventional flat plate shape with small thickness such as a hexagon form, a scale form, etc. For example, the composite metal hydroxide has a crystal form such as an irregular dodecahedron form, an irregular octahedron form, an irregular tetrahedron form, etc.

Such composite metal hydroxide is represented by $M_{1-x}Q_x(OH)_2$. As metal element M, Mg, Ca, Sn and Ti are selected. As metal element Q, Mn, Fe, Co, Ni, Cu and Zn are selected. Here, x is a positive number of 0.01 to 0.5.

The composite metal hydroxide in which the ratio of the major axis relative to the minor axis of the polyhedron form is 1 to 8, preferably 1 to 7 and specially preferably 1 to 4 can be mixed in the resin component for encapsulating a semiconductor. When this ratio exceeds 8, there arises a fear that the molten viscosity of the resin component may be increased.

Now, a method for producing the resin component for encapsulating a semiconductor according to the present embodiment of the invention will be described.

In producing the resin component for encapsulating a semiconductor, firstly, an epoxy resin, a phenolic resin curing agent, a curing accelerator, silica powder whose average particle diameter is 1 μm to 40 μm and whose maximum particle diameter is 200 μm or smaller and magnetic powder whose average particle diameter of 10 μm to 50 μm and whose maximum particle diameter is 200 μm or smaller are mixed together. Further, a prescribed amount of other addition agents such as an inorganic filler, stress-reducing agent, a pigment, a mold releasing agent, a coupling agent, a flame retardant, etc. is added thereto as necessary. Then, the mixture is completely melted and dispersed under the temperature environment of 95° C. to 100° C. by employing a heat roll, an extruder, a kneader, or the like. Finally, the mixture is cooled and pulverized to obtain the powdered resin component for encapsulating a semiconductor passing through a sieve with 10 meshes. Further, the resin component for encapsulating a semiconductor is compression-molded to a tablet as required to produce a resin component for encapsulating a semiconductor having a desired form.

The above-described resin component for encapsulating a semiconductor mainly encapsulates the entire part of a semiconductor element provided in a semiconductor device to minute parts, so that the resin component serves to protect the semiconductor element from a physical contact with an external part and is employed for screening electromagnetic waves.

FIG. 1 is a schematic sectional view of one embodiment of a semiconductor device using the resin component for encapsulating a semiconductor according the present invention.

The semiconductor device 10 is an area mounting type semiconductor device.

On a substrate 11, wiring 12 embedded in through holes is formed. On one surface side of the substrate 11, solder balls 13 connected to the wiring 12 are formed. Further, on the substrate 11, a semiconductor element 14 is arranged and connected to electrodes 15 connected the wiring 12 on the other surface side of the substrate 11 by a wire bonding method. All the part of the semiconductor element 14 is covered with a curing body 16.

Figure 2:
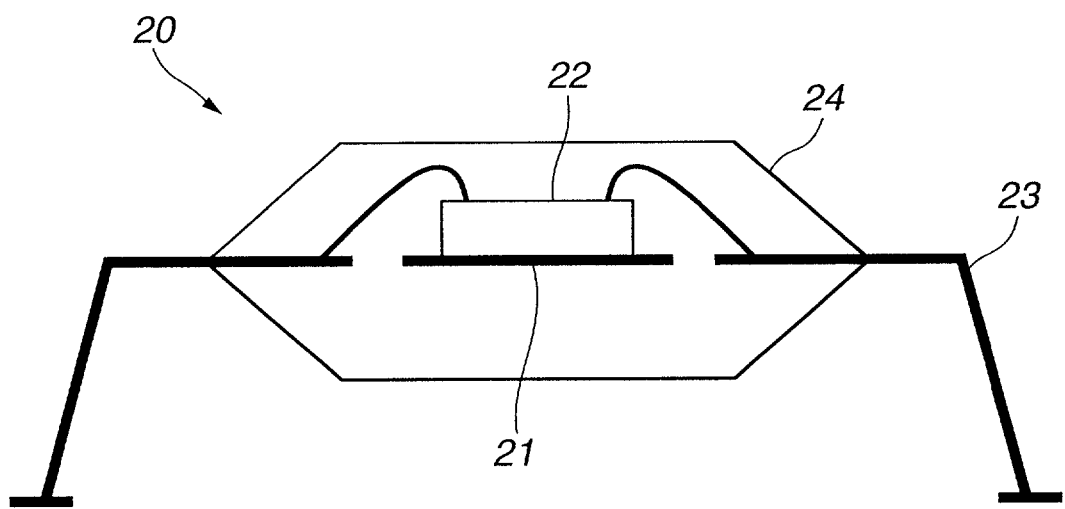
FIG. 2 is a schematic sectional view showing another embodiment of a semiconductor device using the resin component for encapsulating a semiconductor according to the present invention.

FIG. 2 is a schematic sectional view of another embodiment of a semiconductor device using the resin component for encapsulating a semiconductor according to the present invention.

A semiconductor device 20 is a peripheral terminal mounting type semiconductor device. A semiconductor element 22 arranged on a substrate 21 is connected to electrodes 23 by a wire bonding method. The entire part of the semiconductor element 22 is covered from both the surfaces of the substrate 21 with a curing body 24.

The semiconductor devices 10 and 20 having the structures shown in FIGS. 1 and 2 are manufactured by inserting the semiconductor elements 14 and 22 connected to the substrates 11 and 21 into dies, and then, supplying and molding the heated resin component for encapsulating a semiconductor under low pressure by the use of a low pressure transfer molding method.

Initially, the semiconductor elements 14 and 22 respectively arranged on the substrate 11 and 21, and respectively connected to the electrode 15 and 23 by the wire bonding method are set in the dies composed of upper dies and lower dies. Then, the dies are filled with the preheated resin component for encapsulating a semiconductor to press and move the resin component by a plunger and the pressing operation is maintained until the resin component is cured. After the resin component for encapsulating a semiconductor is cured, the upper dies and the lower dies are removed. Thus, the semiconductor devices 10 and 20 in which the semiconductor elements 14 and 22 are encapsulated by the curing bodies 16 and 24 are obtained.

Since the above-described semiconductor devices 10 and 20 are protected from the external part and the electromagnetic waves are shielded by ferrite powder included in the curing bodies 16 and 24, these devices can be applied to electronic devices requiring an EMC. Further, the spaces of ferrite particles are filled with silica particles whose average particle diameter is smaller than the average particle diameter of the ferrite powder and the silica particles are dispersed in the peripheries of the ferrite particles, so that the moldability and the insulating characteristics of the curing bodies 16 and 24 are raised. Thus, a malfunction due to the leakage of current from the semiconductor elements 14 and 22 to the curing bodies 16 and 24 can be prevented.

EXAMPLES

Now, Examples and Comparative Examples of the present embodiment of the invention will be described below.

Example 1

[Production of Resin Component for Encapsulating Semiconductor]

An o-cresol novolac epoxy resin of 100 parts by weight (epoxy equivalent weight 195) having a softening point of 75° C. as an epoxy resin of the resin component for encapsulating a semiconductor, a phenolic novolac resin curing agent of 60 parts by weight (hydroxyl equivalent weight 106) having a softening point of 82° C. as a phenolic resin curing agent, triphenyl phosphine of 1 part by weight, brominated phenolic novolac epoxy resin of 20 parts by weight (epoxy equivalent weight 280), antimony trioxide of 15 parts by weight, carbon black of 2 parts by weight, γ-glycidoxypropyl trimethoxysilane of 1 part by weight as a silane coupling agent, and polyethylene wax of 2 parts by weight are mixed together. Further, spherical silica (silica powder A) of 241 part by weight whose average particle diameter is 5 μm, whose maximum particle diameter is 24 μm and whose specific surface area is 3.0 m²/g and Ni-Zn-Cu soft ferrite of 563 parts by weight (magnetic powder A) whose average particle diameter is 24 μm and whose maximum particle diameter is 128 μm are mixed with the mixture.

Then, this mixture is melted and kneaded by a heat roll heated to the temperature of 95° C. to 100° C. for 3 minutes and the mixture is cooled to obtain powdered resin component for encapsulating a semiconductor passing through a sieve with 10 meshes.

[Manufacture of Compact]

A compact for measuring a complex magnetic permeability is manufactured by tabletizing the obtained powdered resin component for encapsulating a semiconductor to a tablet with the diameter of 35 mm, then, molding the tablet under conditions of molding pressure of 6.86 MPa, the temperature of a die at 175° C. and molding time of 2 minutes, and further, curing the body for 5 hours at the temperature of 175° C. Thus, is manufactured the cylindrical doughnut type compact for measuring the complex magnetic permeability (compact for a coaxial tube test) having the outside diameter of 7 mm, the inside diameter of 3 mm and the thickness of 2 mm.

A compact for measuring volume resistivity is manufactured by tabletizing and forming the powdered resin component for encapsulating a semiconductor to a tablet having the diameter of 35 mm, then, molding the tablet under conditions of molding pressure of 6.86 MPa, the temperature of a die of 175° C. and molding time of 2 minutes, and further curing the body at the temperature of 175° C. for 5 hours. Thus, the disc type compact for measuring the volume resistivity with the thickness of 1 mm and the diameter of 50 mm is manufactured.

(Measurement for Complex Magnetic Permeability)

The complex magnetic permeability " of the compact for measuring complex magnetic permeability thus manufactured is measured under the frequency of 900 MHz by a network analyzer using a device for measuring a material constant.

[Measurement for Volume Resistivity]

Silver paste is employed to manufacture silver electrodes having a main electrode with the diameter of 30 mm, a guard electrode with the diameter of 32 mm and a counter electrode with the diameter of 45 mm. Then, DC voltage of 500 V is applied to measure the volume resistivity of the compact measuring the volume resistivity.

[Inspection of External Appearance]

When the compact for measuring the volume resistivity is manufactured, the length of resin flashes exposed from the cavities of the inner surfaces of upper and lower dies is measured by using vernier caliper.

Respective constituents of the resin component for encapsulating a semiconductor employed in the above-described Example 1, the amount of mixing of them, and evaluation results of them are shown in Table 1.

TABLE 1

|  | Example 1 | Example 2 | Example 3 | Example 4 | Example 5 | Example 6 | Comparative Example |
|---|---|---|---|---|---|---|---|
| o-cresol Novolac Epoxy Resin | 100 | 100 | 100 | 100 | 100 | 100 | 100 |
| Phenolic Novolac Epoxy Resin | 60 | 60 | 60 | 60 | 60 | 60 | 60 |
| Triphenyl Phosphine | 1 | 1 | 1 | 1 | 1 | 1 | 1 |
| Brominated Phenolic Novolac Epoxy Resin | 20 | 20 | 20 | 20 | 20 | 20 | 20 |
| Antimony Trioxide | 15 | 15 | 15 | 15 | 15 | 15 | 15 |
| Carbon Black | 2 | 2 | 2 | 2 | 2 | 2 | 2 |
| Silane Coupling Agent | 1 | 1 | 1 | 1 | 1 | 1 | 1 |

TABLE 1-continued

|  | Example 1 | Example 2 | Example 3 | Example 4 | Example 5 | Example 6 | Comparative Example |
|---|---|---|---|---|---|---|---|
| Polyethylene Wax | 2 | 2 | 2 | 2 | 2 | 2 | 2 |
| Silica Powder A (Average Particle Diameter of 5 um) | 241 | 301 | — | 241 | — | 301 | — |
| Silica Powder B (Average Particle Diameter of 21 um) | — | — | 241 | — | 301 | — | — |
| magnetic powder A (Average Particle Diameter of 24 m) | 563 | 503 | 563 | — | 503 | — | 804 |
| Magnetic powder B (Average Particle Diameter of 10 um) | — | — | — | 563 | — | 503 | — |
| " [—] | 2.19 | 0.72 | 1.72 | 1.65 | 0.54 | 0.35 | 3.18 |
| Volume Resistivity [Ω·cm] | $2 \times 10^{13}$ | $3 \times 10^{13}$ | $3 \times 10^{10}$ | $1 \times 10^{12}$ | $6 \times 10^{10}$ | $3 \times 10^{12}$ | $1 \times 10^{10}$ |
| Resin Flash [mm] | 1 | 1 | 1 | 1 | 1 | 1 | 30 or longer |

Example 2

The amount of mixing of the silica powder A described in the Example 1 is 301 part by weight and the amount of mixing of the magnetic powder A is 503 parts by weight. Other points are the same as those of the Example 1. Respective constituents used in the Example 2 and the amount of mixing of them and the evaluation results of them are shown in Table 1.

Example 3

The silica powder A of 241 part by weight described in the above Example 1 is replaced by spherical silica (silica powder B) of 241 part by weight whose average particle diameter is 21 μm, whose maximum particle diameter is 128 μm and whose specific surface area is 2.3 m²/g.

Example 4

The magnetic powder A of 563 parts by weight described in the above Example 1 is replaced by Ni-Zn-Cu soft ferrite (magnetic powder B) of 563 parts by weight whose average particle diameter is 10 μm and whose maximum particle diameter is 48 μm.

Example 5

The silica powder A of 301 part by weight described in the above Example 2 is replaced by the silica powder B of 301 part by weight. Other points are the same as those of the Example 2. Respective constituents used in the Example 5 and the amount of mixing of them and the evaluation results of them are shown in Table 1.

Example 6

The magnetic powder A of 503 parts by weight described in the above Example 2 is replaced by the magnetic powder B of 503 parts by weight. Other points are the same as those of the Example 2. Respective constituents used in the Example 6 and the amount of mixing of them and the evaluation results of them are shown in Table 1.

Comparative Example

Similarly to the manufacture of the resin component for encapsulating a semiconductor described in the Example 1, o-cresol novolac epoxy resin of 100 parts by weight (epoxy equivalent weight 195) having a softening point of 75° C. as an epoxy resin of the resin component for encapsulating a semiconductor, a phenolic novolac resin curing agent of 60 parts by weight (hydroxyl equivalent weight 106) having a softening point of 82° C. as a phenolic resin curing agent, triphenyl phosphine of 1 part by weight, brominated phenolic novolac epoxy resin of 20 parts by weight (epoxy equivalent weight 280), antimony trioxide of 15 parts by weight, carbon black of 2 parts by weight, γ-glycidoxypropyl trimethoxysilane of 1 part by weight as a silane coupling agent, and polyethylene wax of 2 parts by weight are mixed together. Only the magnetic powder A of 804 parts by weight is mixed with the mixture thus obtained to produce a resin component for encapsulating a semiconductor. Other points are the same as those of the Example 1. Respective constituents used in the Comparative Example and the amount of mixing of them and the evaluation results of them are shown in Table 1.

[Comparison Results]

As described in the Example 1 and the Example 2, the magnetic powder A and the silica powder A whose average particle diameter is smaller than the average particle diameter of the magnetic powder A are mixed for the resin component for encapsulating a semiconductor, so that the volume resistivity is improved more extremely than the Comparative Example in which only the magnetic powder A is used. Further, the Example 1 in which the mixing ratio of the silica powder A is low in the resin component for encapsulating a semiconductor has the electromagnetic wave shielding effect higher than that of the Example 2 and has an extremely high volume resistivity. Further, while, in the Comparative example, the length of the resin flash is 30 mm or longer, it is reduced to 1 mm in the Examples 1 and 2.

In the example 3 and the Example 5 in which the magnetic powder A employed for the resin component for encapsulating a semiconductor of the Example 1 and the Example 2 is not changed, and the silica powder is replaced by the silica powder B whose average particle diameter is larger than that of the silica powder A and smaller than that of the magnetic powder A, the volume resistivity is improved more than the Comparative Example in which only the magnetic powder A is independently employed and the resin flash is more reduced.

Further, in the Example 4 and the Example 6 in which the silica powder A used for the resin component for encapsulating a semiconductor described in the Example 1 and the Example 2 is not changed, and the magnetic powder is replaced by the magnetic powder B whose average particle diameter is smaller than that of the magnetic powder A and larger than that of the silica powder A, the volume resistivity is improved more than that of the Comparative Example in which only the magnetic powder A is independently employed and the resin flash is also more reduced.

Further, the resin components for encapsulating semiconductors described in the Example 1, the Example 2, the Example 4 and the Example 6 have the volume resistivities and the insulating characteristics higher than those of the resin components for encapsulating semiconductors described in the Examples 3 and 5. Accordingly, when the silica powder has its average particle diameter smaller than that of the magnetic powder and the difference between the average particle diameter of the silica powder and the average particle diameter of the magnetic powder is large, the volume resistivity is more effectively increased.

As described above, in the resin component for encapsulating a semiconductor according to the present invention, since the curing body has the electromagnetic wave shielding function and excellent in its moldability, a preferably encapsulated semiconductor device can be manufactured.

Further, since the compact of the resin component for encapsulating a semiconductor according to the present invention includes ferrite powder as its constituent, when the silica powder is mixed therewith at the suitable rate, the insulating characteristics are improved. Therefore, when the semiconductor element in the semiconductor device is encapsulated, a malfunction due to the leakage of electric current to the curing body of the resin component for encapsulating a semiconductor can be prevented.

As described above, according to the present invention, the resin component for encapsulating a semiconductor includes the magnetic powder and the silica powder whose average particle diameter is smaller than the average particle diameter of the magnetic powder. Thus, the electromagnetic waves are shielded owing to the magnetic powder and the spaces of the magnetic powder are filled with the silica powder whose average particle diameter is smaller than that of the magnetic powder, so that the curing body of the resin component for encapsulating a semiconductor is improved in its moldability and enhanced in its insulating characteristics.

The semiconductor device having the electromagnetic wave shielding function and the semiconductor element preferably encapsulated can be manufactured and the malfunction due to the leakage of current from the semiconductor element can be prevented by the resin component for encapsulating a semiconductor according to the present invention.

What is claimed is:

1. A material for encapsulating a semiconductor which encapsulates a semiconductor element comprising:
   an epoxy resin;
   a phenolic resin curing agent for curing the epoxy resin; and
   silica powder and ferromagnetic powder,
   wherein,
   the average particle diameter of the ferromagnetic powder is at least 20 μm and at most 50 μm,
   the ratio S/F is at most 0.25, S being the average particle diameter of the silica powder and F being the average particle diameter of the ferromagnetic powder,
   the volume resistivity of the resin component is at least $1\times10^{13}$ Ω·cm.

2. The material according to claim 1, wherein the maximum particle of the ferromagnetic powder is not larger than 200 μm.

3. The material according to claim 1, wherein the ferromagnetic powder is ferrite.

4. The material according to claim 1, wherein the content of the silica powder is 50 wt % or less as large as the total weight of the silica powder and the ferromagnetic powder.

5. The material according to claim 1, further including a curing accelerator for accelerating the curing of the epoxy resin.

6. A semiconductor device comprising the material according to claim 1.

* * * * *